United States Patent
Sidorov et al.

(10) Patent No.: US 11,404,352 B2
(45) Date of Patent: Aug. 2, 2022

(54) SEMICONDUCTOR DEVICE WITH THROUGH-SUBSTRATE VIA AND ITS METHOD OF MANUFACTURE

(71) Applicant: ams AG, Premstaetten (AT)

(72) Inventors: Victor Sidorov, Ae Eindhoven (NL); Stefan Jessenig, Ae Eindhoven (NL); Georg Parteder, Ae Eindhoven (NL)

(73) Assignee: AMSAG, Premstätten (AT)

( * ) Notice: Subject to any disclaimer, the term of this patent is extended or adjusted under 35 U.S.C. 154(b) by 20 days.

(21) Appl. No.: 16/968,815

(22) PCT Filed: Feb. 15, 2019

(86) PCT No.: PCT/EP2019/053847
§ 371 (c)(1),
(2) Date: Aug. 10, 2020

(87) PCT Pub. No.: WO2019/158706
PCT Pub. Date: Aug. 22, 2019

(65) Prior Publication Data
US 2021/0005534 A1 Jan. 7, 2021

(30) Foreign Application Priority Data
Feb. 19, 2018 (EP) ..................................... 18157371

(51) Int. Cl.
*H01L 23/48* (2006.01)
*H01L 21/768* (2006.01)
*H01L 23/522* (2006.01)

(52) U.S. Cl.
CPC ...... *H01L 23/481* (2013.01); *H01L 21/76802* (2013.01); *H01L 21/76877* (2013.01); *H01L 21/76898* (2013.01); *H01L 23/5226* (2013.01)

(58) Field of Classification Search
CPC ............. H01L 23/481; H01L 21/76802; H01L 21/76877; H01L 21/76898; H01L 23/5226
See application file for complete search history.

(56) References Cited

U.S. PATENT DOCUMENTS

2013/0321680 A1* 12/2013 Kumano ............. H01L 27/1464
348/273
2014/0054743 A1* 2/2014 Hurwitz .............. H01L 29/0642
257/508

(Continued)

FOREIGN PATENT DOCUMENTS

| WO | 2007/024009 | 3/2007 |
| WO | 2009/050207 | 4/2009 |
| WO | 2015/185354 | 12/2015 |

OTHER PUBLICATIONS

European Patent Office, International Search Report for PCT/EP2019/053847 dated Apr. 8, 2019.

*Primary Examiner* — Karen Kusumakar
(74) *Attorney, Agent, or Firm* — MH2 Technology Law Group LLP

(57) ABSTRACT

A dielectric layer is arranged on a main surface of a semiconductor substrate, a metal layer providing a contact area is embedded in the dielectric layer, a top metal is arranged on an opposite main surface of the substrate, and an electrically conductive interconnection through the substrate, which comprises a plurality of metallizations arranged in a plurality of via holes, connects the contact area with the top metal. The plurality of metallizations is surrounded by an insulating layer penetrating the substrate.

6 Claims, 2 Drawing Sheets

(56) References Cited

U.S. PATENT DOCUMENTS

2016/0293487 A1    10/2016   Farooq et al.
2017/0221796 A1     8/2017   Lin et al.

\* cited by examiner

SEMICONDUCTOR DEVICE WITH THROUGH-SUBSTRATE VIA AND ITS METHOD OF MANUFACTURE

The present invention relates to semiconductor devices comprising a through-substrate via.

BACKGROUND OF THE INVENTION

Through-substrate vias, particularly through-silicon vias, are used for electric interconnections between electric conductors that are arranged on opposite surfaces of semiconductor wafers or substrates. The electrically conductive material forming the electric interconnection of such a through-substrate via is usually insulated from the semiconductor material of the substrate by an insulating layer on the sidewall of the via hole. A cleft in the insulating layer may short-circuit the electric interconnection to the semiconductor substrate and thus cause malfunction of the device. If the electrically conductive material is only applied as a thin layer, a crack of the layer may interrupt the electric interconnection.

SUMMARY OF THE INVENTION

The definitions as described above also apply to the following description unless stated otherwise.

The semiconductor device comprises a substrate of semiconductor material, a dielectric layer on a main surface of the substrate, a metal layer embedded in the dielectric layer, a contact area of the metal layer, a top metal on an opposite main surface of the substrate, and an electrically conductive interconnection through the substrate, the electrically conductive interconnection connecting the contact area with the top metal. The electrically conductive interconnection comprises a plurality of metallizations arranged in a plurality of via holes, and the plurality of metallizations is surrounded by an insulating layer penetrating the substrate.

In an embodiment of the semiconductor device, the metallizations are electrically interconnected by the top metal.

In a further embodiment the metallizations are separated from one another by the semiconductor material of the substrate. The metallizations may be in contact with the semiconductor material of the substrate.

The method of producing such a semiconductor device comprises providing a substrate of semiconductor material with a dielectric layer on a main surface and with a metal layer having a contact area embedded in the dielectric layer, etching a trench into the substrate from an opposite main surface of the substrate after the dielectric layer and the metal layer comprising the contact area are formed, the etching of the trench stopping on the dielectric layer, so that the trench reaches to the dielectric layer and completely surrounds a region of the substrate, filling the trench with an electrically insulating material, thus forming an insulating layer, etching a plurality of via holes from the opposite main surface to the contact area within the region surrounded by the insulating layer, arranging metallizations in the via holes, each of the metallizations contacting the contact area, and applying a top metal contacting each of the metallizations above the opposite main surface of the substrate.

In a variant of the method, after arranging the metallizations in the via holes and before applying the top metal, remaining voids in the via holes are filled with a filling material.

In a further variant of the method, the metallizations are arranged immediately on the semiconductor material of the substrate that is exposed in the via holes.

In a further variant of the method, a further dielectric layer is arranged on the opposite main surface of the substrate, and the top metal is applied on the further dielectric layer.

In a further variant of the method, an integrated circuit is formed in the semiconductor material of the substrate, and a plurality of metal layers is formed in the dielectric layer as a wiring of the integrated circuit, the metallizations being connected to the wiring through the contact area.

In a further variant of the method, the via holes and metallizations are arranged on the contact area at vertices of a square grid.

The following is a detailed description of examples of the semiconductor device and the method of production in conjunction with the appended figures.

DETAILED DESCRIPTION

Figure 1:
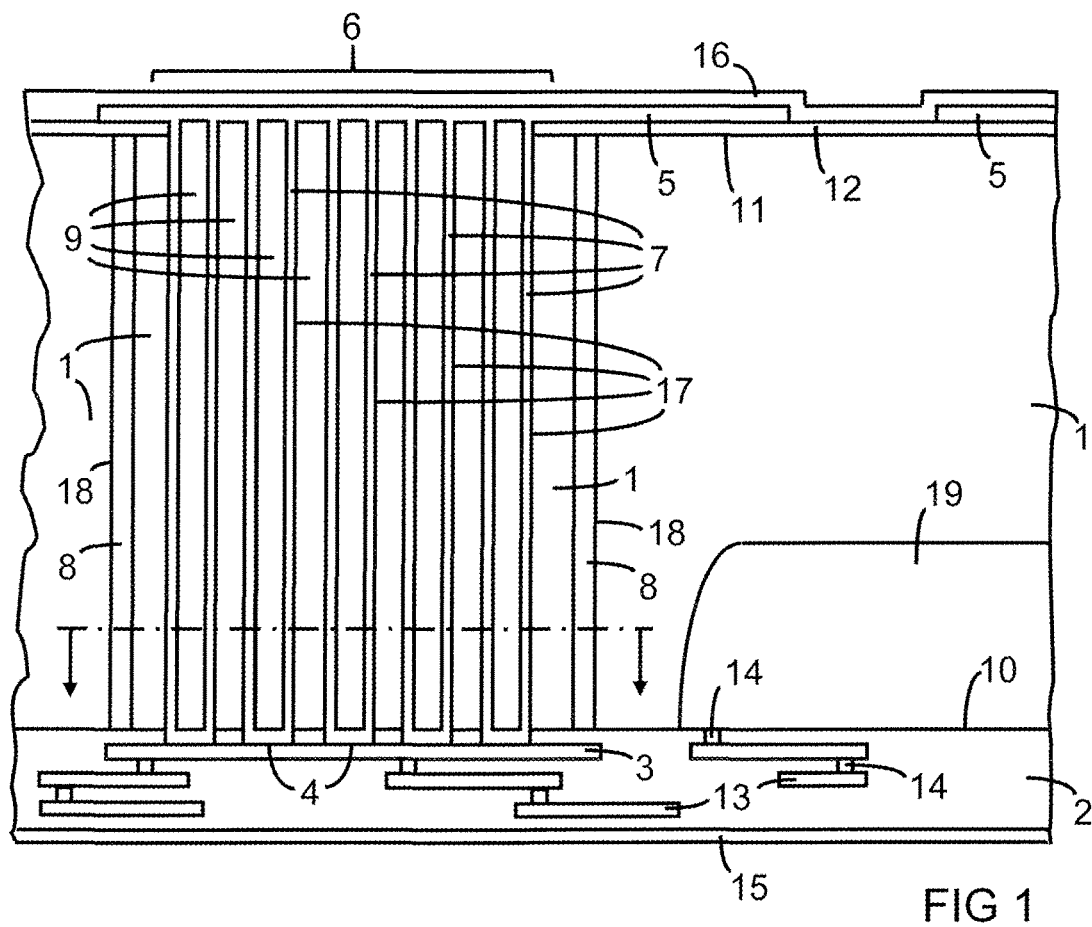
FIG. 1 is a cross section of a semiconductor device comprising a plurality of metallizations forming an interconnection through the substrate.

FIG. 1 is a cross section of a semiconductor device with an electric interconnection through the substrate. The substrate 1 comprises semiconductor material, especially silicon, for instance. A dielectric layer 2 is applied on a main surface 10 of the substrate 1. A metal layer 3 with a contact area 4 is embedded in the dielectric layer 2. The metal layer 3 may especially be one layer of a plurality of metal layers 13, which can be structured and connected by vertical interconnections 14 to form a wiring for an integrated circuit 19 in the substrate 1, in particular a CMOS circuit, for instance. The dielectric layer 3 may be covered by a passivation layer 15.

A top metal 5 is applied above the opposite main surface 11 of the substrate 1. The top metal 5 can be insulated from the semiconductor material by a further dielectric layer 12. The top metal 5 and the optional further dielectric layer 12 may be covered by a further passivation layer 16.

An electric interconnection 6 through the substrate is formed on the contact area 4. The interconnection 6 comprises a plurality of via holes 17 in the substrate 1 and metallizations 7, which are arranged in the via holes 17 in electric contact with the contact area 4. An insulating layer 8, which penetrates the substrate 1, surrounds a region including the interconnection 6 and insulates the plurality of metallizations 7 from a portion of the substrate 1 that is outside the surrounded region. The individual metallizations 7 may be separated from one another by semiconductor material of the substrate 1 inside the surrounded region. The insulating layer 8 can be formed by a trench 18 in the semiconductor material of the substrate 1. The trench 18 may be cylindrical, for instance. A dielectric material in the trench 18 provides the electric insulation. A filling material 9 may fill remaining voids in the via holes 17.

FIG. 1 shows that the insulating layer 8 can be arranged spatially separated from the individual metallizations 7, which form the electrically conductive part of the interconnection 6 through the substrate. This is different from conventional through-substrate vias, wherein the electric conductor of the electric interconnection through the substrate is applied immediately on an insulating layer or an insulating region at the sidewall of a via hole. Furthermore, the arrangement of the via holes 17 and the trench 18 shown in FIG. 1 allows to provide the interconnection 6 with more than one individual metallization 7, so that a plurality of electric conductors can contribute to the interconnection 6 instead of only a single conductor.

Figure 2:
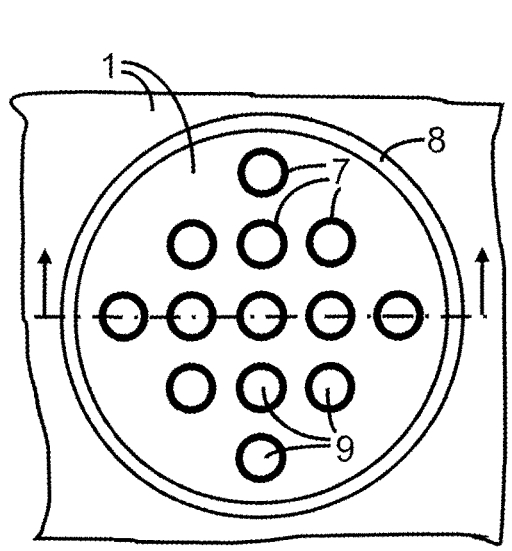
FIG. 2 shows a pattern of the arrangement of the metallizations.

FIG. 2 shows a pattern of the arrangement of the metallizations in the top view that is indicated in FIG. 1 by the horizontal broken line and arrows. In the example shown in FIG. 2, each of the metallizations 7 has the shape of a right circular hollow cylinder. The axes of the metallizations 7 are arranged at vertices of a square grid. The metallizations 7 may instead have other shapes, and their arrangement can differ from the examples shown in the appended figures. The arrangement of the metallizations 7 may especially be irregular. The metallizations 7 may completely fill the via holes 17, or remaining voids may be filled with the filling material 9 shown in FIG. 2.

FIG. 2 shows that the insulating layer 8, which is also a right circular hollow cylinder in this example, surrounds a cylindrical region of the substrate 1 where the plurality of metallizations 7 is arranged. The individual metallizations 7 are separated from one another by semiconductor material of the substrate 1 inside the surrounded region. The horizontal broken line and arrows in FIG. 2 indicate the position of the cross section shown in FIG. 1.

Figure 3:
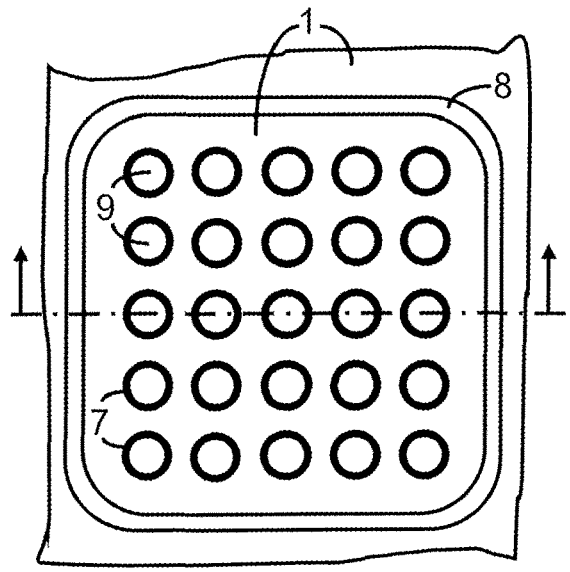
FIG. 3 shows a further pattern of the arrangement of the metallizations.

FIG. 3 shows a further pattern of the arrangement of the metallizations in the top view that is indicated in FIG. 1 by the horizontal broken line and arrows. In the example shown in FIG. 3, the metallizations 7 are also cylindrical and arranged at vertices of a square grid. The metallizations 7 may completely fill the via holes 17, or remaining voids may be filled with a filling material 9.

FIG. 3 shows that, in this example, the insulating layer 8 comprises flat sections connected by rounded edges in a framelike fashion. It surrounds the region of the substrate 1 where the plurality of metallizations 7 is arranged. The individual metallizations 7 are separated from one another by semiconductor material of the substrate 1 inside the surrounded region. The horizontal broken line and arrows in FIG. 3 indicate the position of the cross section shown in FIG. 1.

Figure 4:
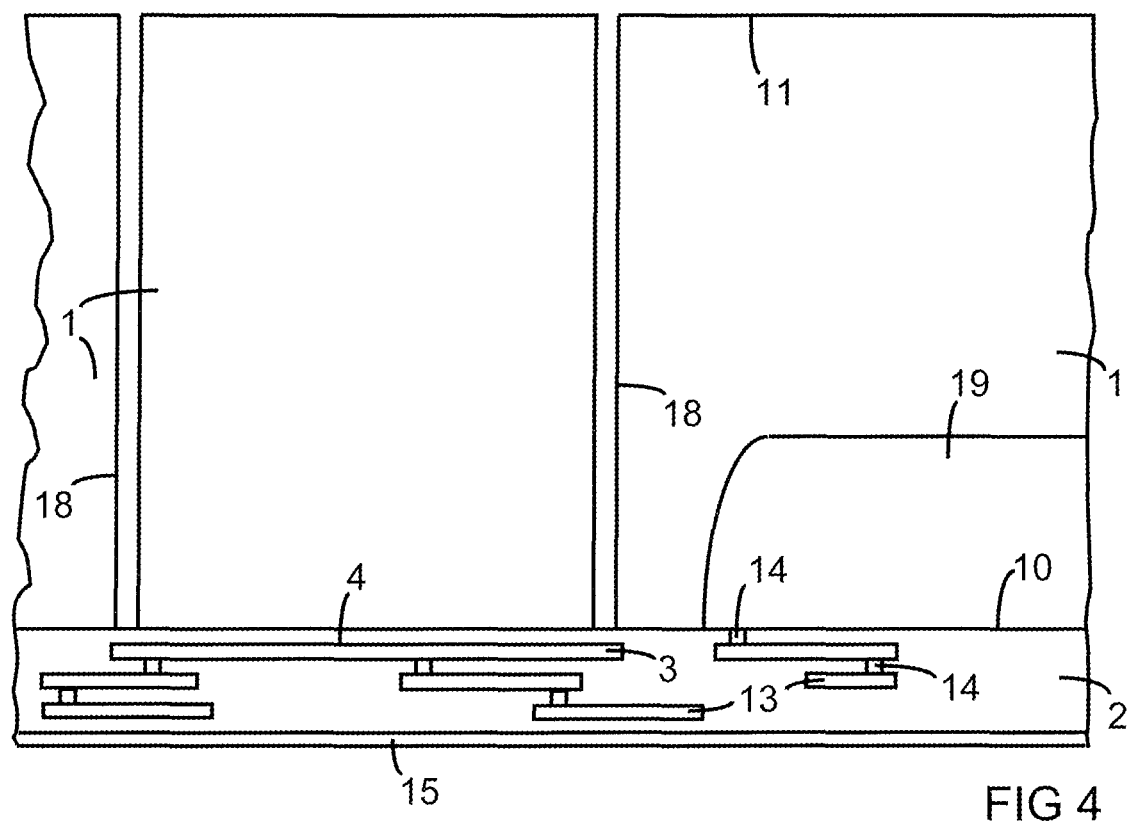
FIG. 4 is a cross section according to FIG. 1 for an intermediate product of the method.

FIG. 4 is a cross section according to FIG. 1 for an intermediate product of the method. Elements corresponding to elements shown in FIG. 1 are indicated with the same reference numerals. FIG. 4 shows the substrate 1, the dielectric layer 2 on the main surface 10, the metal layer 3 of the plurality of metal layers 13 embedded in the dielectric layer 2, the contact area 4, the vertical interconnections 14, and the passivation layer 15. A trench 18, which surrounds a region of the substrate 1 opposite the contact area 4, is etched into the substrate 1 from the opposite main surface 11. The trench 18 penetrates the substrate 1 and reaches the dielectric layer 2. The etching of the trench 18 stops on the dielectric layer 2.

Figure 5:
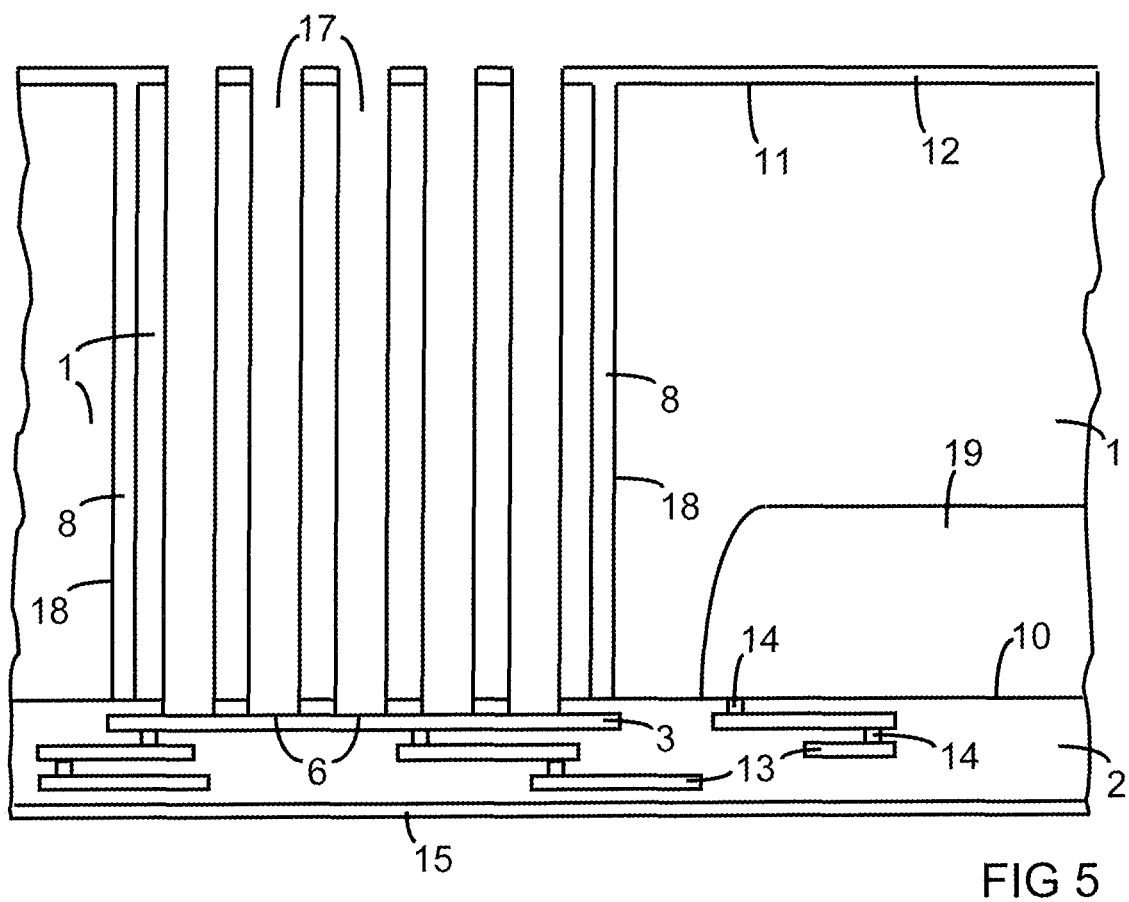
FIG. 5 is a cross section according to FIG. 4 for a further intermediate product comprising via holes.

FIG. 5 is a cross section according to FIG. 4 for a further intermediate product of the method. Elements corresponding to elements shown in FIG. 4 are indicated with the same reference numerals. The trench 18 is filled with dielectric material, which may be an oxide of the semiconductor material, for instance, to form the insulating layer 8. The dielectric material can also be used to form the further dielectric layer 12 on the opposite main surface 11 of the substrate 1. Then the via holes 17 are etched into the substrate 1 until the contact area 4 is exposed in the via holes 17.

The metallizations 7 are arranged in the via holes 17 to form a plurality of electric contacts on the contact area 4. The top metal 5 can be formed in the same method step together with the metallizations 7, or it may be applied as a further metal layer, which is electrically connected to the metallizations 7. The remaining voids of the via holes 17 are optionally filled with a filling material 9, especially if the top metal 5 is provided as a separate metal layer continuously covering the interconnection 6. The further layers shown in FIG. 1 are applied, and thus the device according to FIG. 1 is obtained.

The described structure of the through-substrate via has the advantages that the insulating layer surrounding the plurality of metallizations provides a secure electric insulation from the outer portion of the semiconductor substrate and that cracks of individual metallizations will not entirely interrupt the electric interconnection through the substrate. Moreover, the electrical conductivity of the interconnection is enhanced by the use of a plurality of metallizations.

The invention claimed is:

1. A method of producing a semiconductor device, comprising:
    providing a substrate of semiconductor material with a dielectric layer on a main surface of the substrate, a metal layer embedded in the dielectric layer, and a contact area of the metal layer,
    etching a trench into the substrate from an opposite main surface of the substrate after the dielectric layer and the metal layer comprising the contact area are formed, the etching of the trench stopping on the dielectric layer, so that the trench reaches to the dielectric layer and completely surrounds a region of the substrate,
    filling the trench with an electrically insulating material, thus forming an insulating layer,
    etching a plurality of via holes from the opposite main surface of the substrate to the contact area within the region surrounded by the insulating layer,
    arranging metallizations in the via holes, each of the metallizations contacting the contact area, and
    applying a top metal contacting each of the metallizations above the opposite main surface of the substrate.

2. The method according to claim 1, further comprising:
    after arranging the metallizations in the via holes and before applying the top metal, filling remaining voids in the via holes with a filling material.

3. The method according to claim 1, wherein the metallizations are arranged immediately on the semiconductor material of the substrate that is exposed in the via holes.

4. The method according to claim 1, further comprising:
    arranging a further dielectric layer on the opposite main surface of the substrate, and
    applying the top metal on the further dielectric layer.

5. The method according to claim 1, further comprising:
    forming an integrated circuit in the semiconductor material of the substrate, and
    forming a plurality of metal layers in the dielectric layer as a wiring of the integrated circuit, the metallizations being connected to the wiring through the contact area.

6. The method according to claim 1, wherein the via holes and metallizations are arranged on the contact area at vertices of a square grid.

\* \* \* \* \*